United States Patent
Lee et al.

(10) Patent No.: US 10,142,058 B2
(45) Date of Patent: *Nov. 27, 2018

(54) COMMUNICATION DEVICE AND COMMUNICATION METHOD

(71) Applicant: LSIS CO., LTD., Anyang-si, Gyeonggi-do (KR)

(72) Inventors: Sung Han Lee, Anyang-si (KR); Dae Hyun Kwon, Anyang-si (KR); Joon Seok Oh, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/382,535

(22) PCT Filed: Oct. 22, 2012

(86) PCT No.: PCT/KR2012/008654
§ 371 (c)(1),
(2) Date: Sep. 2, 2014

(87) PCT Pub. No.: WO2013/129752
PCT Pub. Date: Sep. 6, 2013

(65) Prior Publication Data
US 2015/0113363 A1    Apr. 23, 2015

Related U.S. Application Data

(60) Provisional application No. 61/605,768, filed on Mar. 2, 2012.

(51) Int. Cl.
*H04L 1/00* (2006.01)
*H03M 13/09* (2006.01)
(Continued)

(52) U.S. Cl.
CPC ........ *H04L 1/0061* (2013.01); *H03M 13/095* (2013.01); *H04L 1/24* (2013.01);
(Continued)

(58) Field of Classification Search
CPC ..... H04L 69/22; H04L 1/0075; H04L 1/0041; H04L 1/0045; H04L 1/0061; H04L 1/24;
(Continued)

(56) References Cited

U.S. PATENT DOCUMENTS 4,716,566 A * 12/1987 Masuhara ............ H03M 13/19
714/758
6,075,552 A * 6/2000 Hasegawa ............ H04H 20/12
348/192

(Continued)

FOREIGN PATENT DOCUMENTS

CN    1294831    5/2001
CN    101107864  1/2008
(Continued)

OTHER PUBLICATIONS

Nagami, et al., "Toshiba's Flow Attribute Notification Protocol (FANP) Specification," IETF RFC 2129, Apr. 1997, 19 pages.
(Continued)

*Primary Examiner* — April Y Blair
*Assistant Examiner* — Sazzad Hossain
(74) *Attorney, Agent, or Firm* — K&L Gates LLP

(57) ABSTRACT

A method for a first communication device transmitting data to a second communication device, according to one embodiment of the present invention, comprises the steps of: the first communication device generating a safety unique identifier by using a unique identifier of the first communication device and a unique identifier of the second communication device, in order to confirm the validity of connection between the first communication device and the second (Continued)

communication device; the first communication device calculating a data error detection code for detecting an error by using the safety unique identifier and the data; the first communication device generating a packet comprising the data and the data error detection code; and the first communication device transmitting the packet to the second communication device.

9 Claims, 4 Drawing Sheets

(51) Int. Cl.
*H04L 29/08* (2006.01)
*H04L 1/24* (2006.01)
*H04L 29/06* (2006.01)

(52) U.S. Cl.
CPC ........ *H04L 67/10* (2013.01); *G06F 2212/403* (2013.01); *H03M 13/09* (2013.01); *H04L 1/0041* (2013.01); *H04L 1/0045* (2013.01); *H04L 1/0075* (2013.01); *H04L 69/22* (2013.01)

(58) Field of Classification Search
CPC .. H04L 67/10; G06F 2212/403; H03M 13/09; H03M 13/095
USPC ..... 370/473, 476; 375/240.27; 714/758, 776
See application file for complete search history.

(56) References Cited

U.S. PATENT DOCUMENTS

| | | | |
|---|---|---|---|
| 2002/0067758 | A1 | 6/2002 | D'Amico |
| 2005/0216816 | A1* | 9/2005 | Kojima ............ G11B 20/00086 714/758 |
| 2005/0231329 | A1* | 10/2005 | Friedrich ............. G06K 7/0008 340/10.3 |
| 2006/0280204 | A1* | 12/2006 | Nagata ................. H04L 1/1671 370/473 |
| 2008/0195912 | A1* | 8/2008 | Mende .................. H03M 13/09 714/752 |
| 2009/0125633 | A1 | 5/2009 | Watsen et al. |
| 2009/0307568 | A1* | 12/2009 | Takaku ................... H04L 1/004 714/807 |
| 2009/0327826 | A1 | 12/2009 | Inoue et al. |
| 2010/0215042 | A1* | 8/2010 | Sato ...................... H04L 12/413 370/392 |
| 2011/0246670 | A1* | 10/2011 | Ishikawa ............... G06F 9/4436 709/238 |
| 2013/0162190 | A1* | 6/2013 | Smith ..................... H02P 31/00 318/490 |

FOREIGN PATENT DOCUMENTS

| | | |
|---|---|---|
| CN | 101223761 | 7/2008 |
| CN | 101355403 A | 1/2009 |
| CN | 101621471 A | 1/2010 |
| JP | 2010-011296 | 1/2010 |
| JP | 2010-206394 | 9/2010 |
| KR | 10-2003-0029980 | 4/2003 |
| KR | 10-2008-0050908 | 6/2008 |
| KR | 10-2012-0010961 | 2/2012 |
| WO | 99/49695 | 9/1999 |
| WO | 2012/009691 | 1/2012 |

OTHER PUBLICATIONS

Japan Patent Office Application Serial No. 2014-559812, Office Action dated Dec. 8, 2015, 3 pages.
European Patent Office Application Serial No. 12869882.6, Search Report dated Aug. 10, 2015, 10 pages.
Japan Patent Office Application Serial No. 2014-559812, Office Action dated Jul. 14, 2015, 3 pages.
The State Intellectual Property Office of the People's Republic of China Application Serial No. 201280072946.8, Office Action dated Dec. 2, 2016, 9 pages.
Chinese Office Action for related Chinese Application No. 201280072946.8; action dated Feb. 2, 2018; ( 11 pages).

* cited by examiner

COMMUNICATION DEVICE AND COMMUNICATION METHOD

CROSS-REFERENCE TO RELATED APPLICATIONS

This application is the National Stage filing under 35 U.S.C. 371 of International Application No. PCT/KR2012/008654, filed on Oct. 22, 2012, which claims the benefit of U.S. Provisional Application Ser. No. 61/605,768, filed on Mar. 2, 2012, the contents of which are all hereby incorporated by reference herein in their entirety.

TECHNICAL FIELD

The present disclosure relates to a communication device and a communication method, and more particularly, to a safety communication device and a safety communication method.

BACKGROUND ART

Solutions for safety communication to be used in industrial fields are currently sought. In particular, industrial control systems are required to maintain a prescribed or higher level of integrity of information transferred via a network in order to secure the safety of workers, avoid threats to environment and prevent the occurrence of safety-related problems.

In order to satisfy such integrity requirements, industrial control systems are required to treat problems about corruption, unintended repetition, incorrect sequence, loss, unacceptable delay, insertion, masquerade and addressing.

Regarding the problem of corruption, industrial control systems should be able to determine whether an error occurs in data being transferred, with a prescribed or higher level of probability.

Regarding the problem of unintended repetition, industrial control systems should be able to determine whether data repetition which is not maliciously intended by a person occurs normally, with a prescribed or higher level of probability.

Regarding the problem of incorrect sequence, industrial control systems should be able to determine whether a sequence of transmission of data is changed, with a prescribed or higher level of probability.

Regarding the problem of loss, industrial control systems should be able to determine whether a part of transmitted data is damaged, with a prescribed or higher level of probability.

Regarding the problem of unacceptable delay, industrial control systems should be able to determine whether an unacceptable delay occurs in transmission of data, with a prescribed or higher level of probability.

Regarding the problem of insertion, industrial control systems should be able to determine whether unintended data is inserted while transmitting data, with a prescribed or higher level of probability.

Regarding the problem of masquerade, industrial control systems should be able to determine whether data is changed maliciously by a person, with a prescribed or higher level of probability.

Regarding the problem of addressing, industrial control systems should be able to determine whether data is transmitted to a right receiver, with a prescribed or higher level of probability.

IEC 61508 represents a probability of error occurrence using SIL as shown in table 1 below.

TABLE 1

| SIL4 | $>=10^{-9}, <10^{-8}$ |
| SIL3 | $>=10^{-8}, <10^{-7}$ |
| SIL2 | $>=10^{-7}, <10^{-6}$ |
| SIL1 | $>=10^{-6}, <10^{-5}$ |

For example, to satisfy SIL3, the probability of error occurrence should satisfy $10^{-9}$.

However, it is difficult for current Ethernet frame structures to satisfy the integrity requirements of industrial control systems.

DISCLOSURE OF THE INVENTION

Technical Problem

Embodiments provide a communication device and a communication method satisfying the integrity requirements of industrial control systems.

Technical Solution

In one embodiment, a communication method for transmitting, by a first communication device, data to a second communication device includes generating, by the first communication device, a safety unique identifier for confirming the validity of connection between the first communication device and the second communication device using a unique identifier of the first communication device and a unique identifier of the second communication device, calculating, by the first communication device, a data error detection code for detecting an error using the safety unique identifier and data, generating, by the first communication device, a packet including the data and the data error detection code, and transmitting, by the first communication device, the packet to the second communication device.

In another embodiment, a communication method for receiving, by a first communication device, data from a second communication device includes receiving, by the first communication device, a packet from the second communication device, obtaining, by the first communication device, data and a received data error detection code from the packet, calculating, by the first communication device, a comparative data error detection code using the data, and determining, by the first communication device, whether the packet has an error on the basis of the received data error detection code and the comparative data error detection code.

Advantageous Effects

According to the embodiments of the present disclosure, the integrity requirements of industrial control systems may be satisfied.

Furthermore, according to the embodiments of the present disclosure, a safety unique identifier for establishing a connection between communication devices is generated so as to satisfy the integrity requirements of industrial control systems.

MODE FOR CARRYING OUT THE INVENTION

Hereinafter, a communication device and a communication method according to embodiments will be described in detail with reference to the accompanying drawings. In the following description, the terms "module" and "unit" for referring to elements are assigned thereto and used exchangeably for convenience, and thus, the terms per se do not necessarily represent different meanings or functions.

Figure 1:
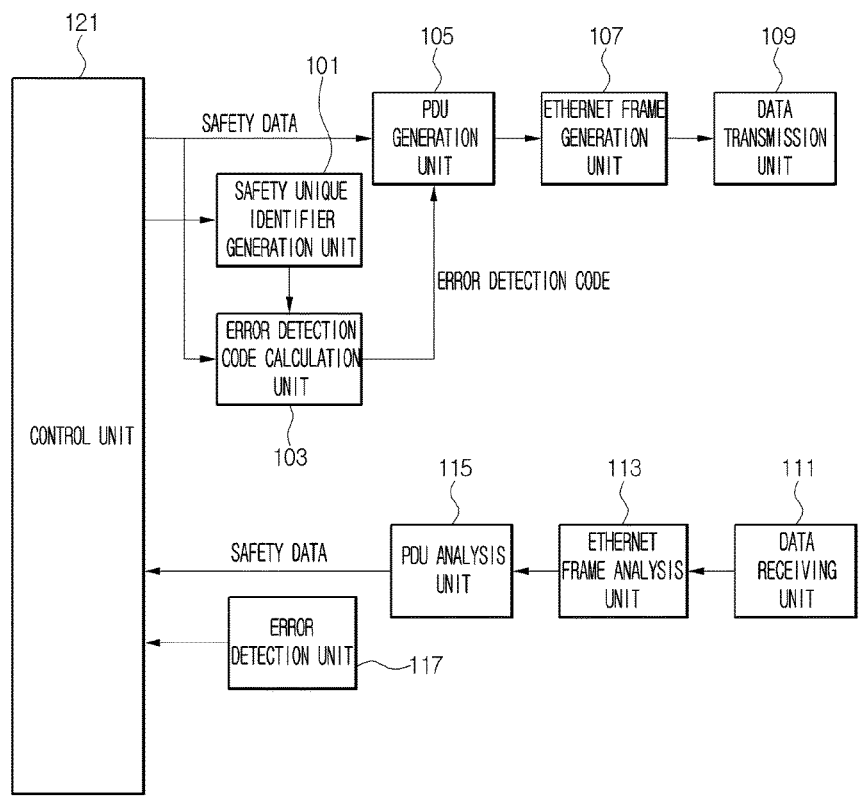
FIG. 1 is a block diagram illustrating a safety communication device according to an embodiment.

FIG. 1 is a block diagram illustrating a safety communication device according to an embodiment.

As illustrated in FIG. 1, a safety communication device 100 according to an embodiment includes a safety unique identifier generation unit 101, an error detection code calculation unit 103, a protocol data unit (PDU) generation unit 105, an Ethernet frame generation unit 107, a data transmission unit 109, a data receiving unit 111, an Ethernet frame analysis unit 113, a protocol data unit analysis unit 115, an error detection unit 117, and a control unit 121.

The safety unique identifier generation unit 101 may generate a safety unique identifier (SUID) by combining a unique identifier of the safety communication device 100 and the unique identifier of another safety communication device 100.

The control unit 121 may generate safety data, and may provide the generated safety data to the error detection code calculation unit 103.

The error detection code calculation unit 103 may calculate a data error detection code for the safety unique identifier and the safety data using the generated safety unique identifier and safety data.

The protocol data unit generation unit 105 may generate a protocol data unit (PDU) including the calculated data error detection code, the safety data and a safety PDU header.

The Ethernet frame generation unit 107 may generate an Ethernet frame including the generated safety protocol data unit.

The data transmission unit 109 may transmit the generated Ethernet frame to another safety communication device.

The data receiving unit 111 may receive the Ethernet frame including the safety protocol data unit from another safety communication device.

The Ethernet frame analysis unit 113 may analyze the received Ethernet frame to obtain the safety protocol data unit.

The protocol data unit analysis unit 115 may analyze the protocol data unit to obtain the error detection code and the safety data.

The error detection unit 117 may calculate a comparative data error detection code using the safety data.

The error detection unit 117 may compare the calculated error detection code with the obtained error detection code to detect an error.

The control unit 121 may control overall operation of the safety communication device 100.

When it is determined that an error has occurred in the safety data, the control unit 121 may changes an operation state of the safety communication device 100 into a fail-safe state. In the fail-safe state, the safety communication device 100 suspends the safety communication until the user input for reset is received. In particular, in the fail-safe state, the safety communication device 100 may or may not suspend communication other than the communication related to the safety data, but suspends at least the communication related to the safety data.

When it is confirmed that the obtained safety unique identifier exists within the safety communication device 100, the control unit 121 may consume the received safety data, and may generate the safety data to be transmitted next. If the received safety data is related to a request, the control unit 121 generates the safety data related to a response. If the received safety data is related to a response, the control unit 121 generates the safety data related to a next request.

Figure 2:
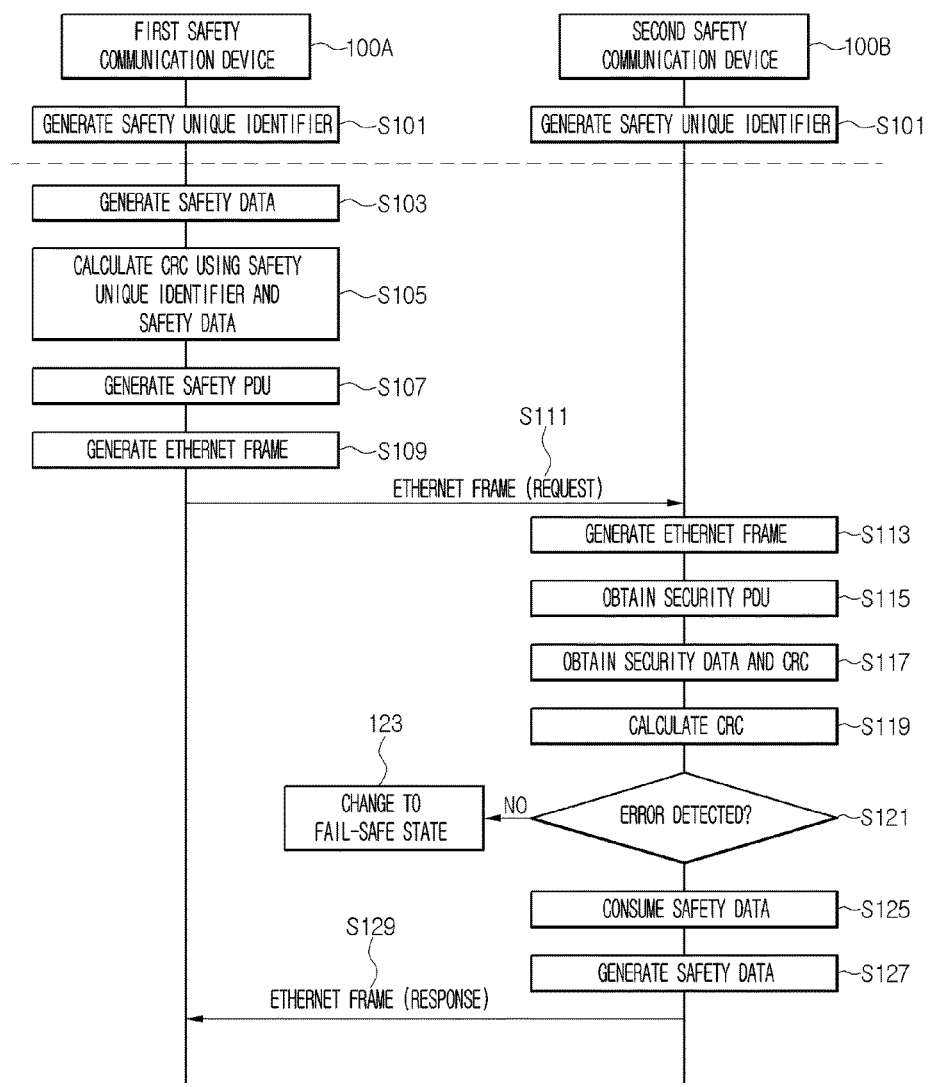
FIG. 2 is a ladder diagram illustrating a communication method according to an embodiment.

FIG. 2 is a ladder diagram illustrating a communication method according to an embodiment.

As illustrated in FIG. 2, it is assumed that a first safety communication device 100A communicates with a second communication device 100B, the first safety communication device 100A transmits a safety protocol data unit request to the second safety communication device 100B, and the second safety communication device 100B transmits a safety protocol data unit response to the first safety communication device 100A.

The communication method according to an embodiment relates to mutual authentication (or interconnection) performed before actual data transmission/reception between the first safety communication device 100A and the second safety communication device 100B.

The safety unique identifier generation unit 101 of the safety communication device 100 generates the SUID by combining the unique identifier of the first safety communication device 100A and the unique identifier of the second safety communication device 100B (operation S101). That is, the safety unique identifier generation unit 101 of the first safety communication device 100A may foreknow the unique identifier of the second safety communication device 100B to be connected to the first safety communication device 100A, and may generate the SUID using the unique identifier of the second safety communication device 100B.

Likewise, the safety unique identifier generation unit 101 of the second safety communication device 100B may foreknow the unique identifier of the first safety communication device 100A to be connected to the second safety communication device 100B, and may generate the SUID using the unique identifier of the first safety communication device 100A.

In one embodiment, the safety unique identifier generation unit 101 of the first safety communication device 100A may foreknow the unique identifier of another safety communication device other than the second safety communication device 100B, and may generate and hold an additional SUID by combining the unique identifier of the first safety communication device 100A and the unique identifier of the other safety communication device.

A process of generating the SUID according to an embodiment will be described with reference to FIGS. 3 and 4.

Figure 3:
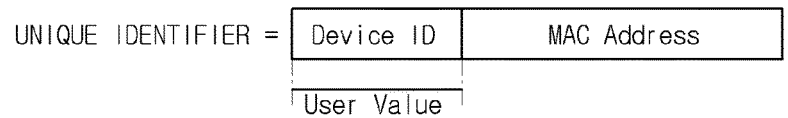
FIG. 3 is a diagram illustrating a unique identifier according to an embodiment.
Figure 4:
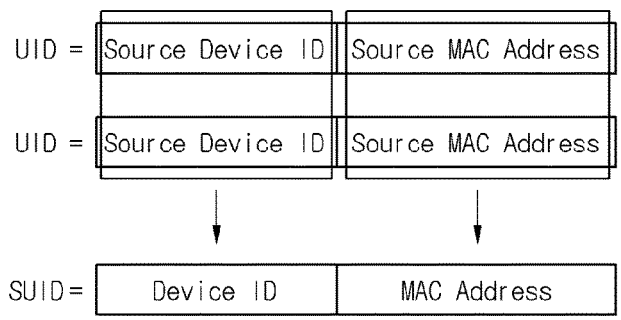
FIG. 4 is a diagram illustrating a process of generating a safety unique identifier according to an embodiment.

FIG. 3 is a diagram illustrating the unique identifier according to an embodiment, and FIG. 4 is a diagram illustrating the process of generating the SUID according to an embodiment.

As illustrated in FIG. 3, the unique identifier according to an embodiment may be generated by combining a user value and a media address control (MAC) address.

The user value may any one of an arbitrary value predetermined according to a user setting, a value of a specific range determined according to the user setting, an identifier of a safety communication device, and an address of the safety communication device.

The user value illustrated in FIG. 3 may be a device identifier. Here, the device identifier may be the identifier of the safety communication device.

The MAC address may include information for accessing an Ethernet.

The size of the unique identifier according to an embodiment may be 64 bits, but is not limited thereto.

The sizes of the device identifier and the MAC address may be 16 bits and 48 bits respectively, but are not limited thereto.

As illustrated in FIG. 4, the safety unique identifier generation unit 101 of the first safety communication device 100A may generate the SUID using a source device identifier, a source MAC address, a destination device identifier, and a destination MAC address.

The SUID may be used to confirm the validity of connection between the first safety communication device 100A and another safety communication device. In the case where the first safety communication device 100A and the other safety communication device have the SUIDs corresponding to each other, the validity of connection between the first safety communication device 100A and the other safety communication device may be confirmed.

In detail, as shown in Equation 1 below, the the safety unique identifier generation unit 101 of the first safety communication device 100A may generate the SUID using the source device identifier, the source MAC address, the destination device identifier, and the destination MAC address.

$$SUID = f(\text{source MAC address and device ID, destination MAC address and device ID}) \quad \text{[Equation 1]}$$

In more detail, the safety unique identifier generation unit 101 of the first safety communication device 100A may generate a device identifier for the SUID by combining the source device identifier of the unique identifier of the first safety communication device 100A and the destination device identifier of the unique identifier of the second safety communication device 100B, may generate a MAC address for the SUID by combining the MAC address of the unique identifier of the first safety communication device 100A and the MAC address of the unique identifier of the second safety communication device 100B, and may generate the SUID by combining the generated device identifier and the generated MAC address.

The requirement of security between safety communication devices may be satisfied by the device identifier for the generated SUID, and the requirement of uniqueness between the safety communication devices may be satisfied by the MAC address for the generated SUID.

Since the first safety communication device 100A transmits the safety data and the second safety communication device 100B receives the safety data, the first safety communication device 100A is a source and the second safety communication device 100B is a destination. In this case, the SUID may be a combination of the MAC address of the first safety communication device 100A, the device identifier of the first safety communication device 100A, the MAC address of the second safety communication device 100B, and the device identifier of the second safety communication device 100B.

The size of the generated SUID may be 8 octets, but is not limited thereto. One octet generally represents 8 bits.

The sizes of the device identifier and MAC address of the generated SUID may be 2 octets and 6 octets respectively, but are not limited thereto.

Referring back to FIG. 2, the control unit 121 of the first safety communication device 100A generates the safety data for a request (operation S103). The control unit 121 of the first safety communication device 100A may generate safety header data related to the request safety data together with the request safety data.

Referring back to FIG. 2, the error detection code calculation unit 103 of the first safety communication device 100A calculates a data error detection code for the SUID and the safety data using the generated SUID and the safety data (operation S105). Here, the error detection code calculation unit 103 of the first safety communication device 100A may calculate a header error detection code for the safety header data using the safety header data. The error detection code may be calculated using a hash function, wherein cyclic redundancy check (CRC) may be used as the hash function. The error detection code may be a CRC value.

In particular, as shown in Equation 2 below, the error detection code calculation unit 103 of the first safety communication device 100A may calculate the header error detection code HEADER_CRC using a header field, the SUID and a sequence number.

$$\text{HEADER\_CRC} := f(\text{SUID, Sequence\_Number, header\_field}) \quad \text{[Equation 2]}$$

In Equation 1, $f$ denotes a hash function.

The SUID may be used only for calculating the error detection code, without being included in the safety PDU.

The sequence number may represent a sequence number of the safety PDU. The sequence number used for calculating the error detection code may be a virtual sequence number that is not included in the safety PDU. That is, the first safety communication device 100A uses the virtual sequence number to calculate the error detection code, but does not transmit the virtual sequence number to the second safety communication device 100B.

As shown in Equation 3 below, the error detection code calculation unit 103 of the first safety communication device 100A may calculate the data error detection code DATA_CRC using the safety data, the SUID and the sequence number.

$$\text{DATA\_CRC} := f(\text{SUID, Sequence\_Number, Safety\_Data}) \quad \text{[Equation 3]}$$

In Equation 3, $f$ denotes a hash function.

FIG. 2 will be described again.

The protocol data unit generation unit 105 of the first safety communication device 100A generates the safety PDU including the safety data and the calculated data error detection code (operation S107). Here, the safety PDU may further include the safety header data and the calculated header error detection code. A structure of the safety PDU according to an embodiment will be described with reference to FIG. 5.

Figure 5:
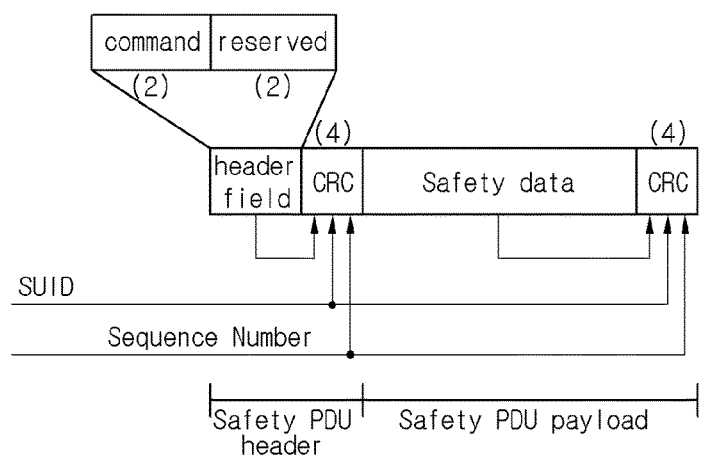
FIG. 5 illustrates a structure of a safety protocol data unit according to an embodiment.

FIG. 5 illustrates the structure of the safety PDU according to an embodiment.

As illustrated in FIG. 5, the safety PDU sequentially includes a safety PDU header and a safety PDU payload. The safety PDU header sequentially includes a safety header field and the header error detection code. In particular, the safety PDU header may be arranged at a forefront of the safety PDU. The safety PDU header sequentially includes a command field and a reserved field. The safety data may be related to the safety PDU. In particular, the safety data may be related to the command field. In particular, in the embodiment of FIG. 5, the safety header field has a size of 4 octets, the command field has a size of 2 octets, the reserved field has a size of 2 octets, the header error detection code has a size of 4 octets, and the data error detection code has a size of 4 octets; however, the sizes of the fields are not necessarily limited thereto. One octet generally represents 8 bits.

Table 2 shows examples of values of the command field according to an embodiment.

TABLE 2

| Command | Description |
|---|---|
| 0x01 | RESET |
| 0x02 | CONNECTION |
| 0x03 | PARAMETER |
| 0x04 | DATA |

As shown in Table 2, if the value of the command field is 0x01, the safety data may represent a reset command. If the value of the command field is 0x02, the safety data may represent a connection command. If the value of the command field is 0x03, the safety data may represent a parameter transmission command. If the value of the command field is 0x04, the safety data may represent a data transmission command.

In particular, the embodiment of FIG. 2 may correspond to a communication method in a connection state in which the command field has the value corresponding to the connection command. In the connection state, the first safety communication device 100A may correspond to an initiator, and the second safety communication device 100B may correspond to a responder. The initiator may transmit the request safety data to the responder, without transmitting response safety data thereto. The responder may transmit the response safety data corresponding to the request safety data to the initiator, without transmitting the request safety data thereto.

The reserved field may be used later for other purposes. FIG. 2 will be described again.

The Ethernet frame generation unit 107 of the first safety communication device 100A generates an Ethernet frame including the request safety data (operation S109). Here, the Ethernet frame related to a request may include the generated safety PDU. A structure of the Ethernet frame according to an embodiment will be described with reference to FIG. 6.

Figure 6:
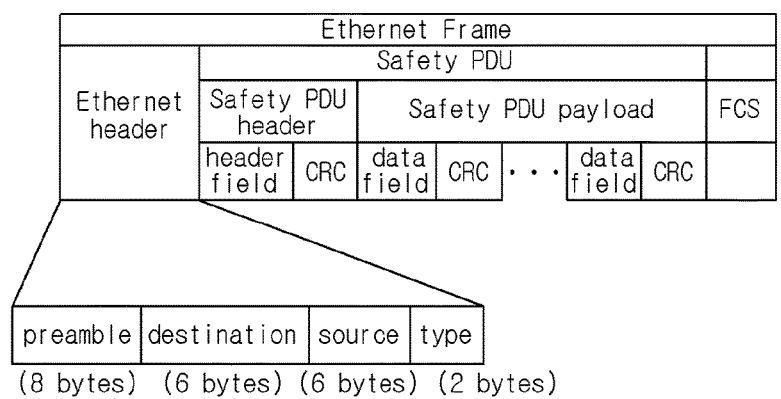
FIG. 6 illustrates a structure of an Ethernet frame according to an embodiment.

FIG. 6 illustrates the structure of the Ethernet frame according to an embodiment.

As illustrated in FIG. 6, the Ethernet frame sequentially includes an Ethernet header, an Ethernet payload, and a frame check sequence (FCS). The Ethernet frame includes the safety PDU as the payload. The Ethernet frame header includes a preamble field, a destination address field, a source address field, and a type field. The destination address field contains an address of a safety communication device corresponding to a destination, and the source address field contains an address of a safety communication device corresponding to a source. The frame check sequence may be generated using data within the Ethernet header and data within the payload. FIG. 2 will be described again.

The data transmission unit 109 of the first safety communication device 100A transmits the Ethernet frame including the request safety data to the second safety communication device 100B (operation S111). In this manner, the data transmission unit 109 may transmit the generated safety PDU to the second safety communication device 100B.

Here, the Ethernet frame transmitted to the second safety communication device 100B does not include the generated SUID.

The data receiving unit 111 of the second safety communication device 100B receives, from the first safety communication device 100A, the Ethernet frame including the safety PDU including the request safety data (operation S113). Here, the Ethernet frame may have the structure as illustrated in FIG. 6.

The Ethernet frame analysis unit 113 of the second safety communication device 100B analyzes the received Ethernet frame to obtain the safety PDU (operation S115). Here, the safety PDU may have the structure as illustrated in FIG. 7.

The protocol data unit analysis unit 115 of the second safety communication device 100B analyzes the protocol data unit to obtain the safety header data, a received header error detection code, the request safety data, and a received data error detection code (operation S117). The error detection unit 117 of the second safety communication device 100B calculates a comparative data error detection code using the request safety data (operation S119). In addition, the error detection unit 180 of the second safety communication device 100B may calculate a comparative header error detection code using the safety header data. As described above, the error detection unit 117 of the second safety communication device 100B may calculate the comparative header error detection code for detecting an error of the header data field using the header data.

In particular, the error detection unit 117 of the second safety communication device 100B may calculate the comparative header error detection code using Equation 2.

Furthermore, the error detection unit 117 of the second safety communication device 100B may calculate the comparative data error detection code using Equation 3.

The error detection unit 117 of the second safety communication device 100B compares a calculated error detection code with an obtained error detection code to detect an error (operation S121). In the case where the comparative data error detection code is equal to the received data error detection code and the comparative header error detection code is equal to the received header error detection code, the error detection unit 117 may determine that an error has not occurred in the safety data. On the contrary, in the case where the comparative data error detection code is different from the received data error detection code or the comparative header error detection code is different from the received header error detection code, the error detection unit 117 may determine that an error has occurred in the safety data.

In detail, in the case where the comparative data error detection code is equal to the received data error detection code and the comparative header error detection code is equal to the received header error detection code, the error detection unit 117 may determine that the SUID of the first safety communication device 100A matches that of the second safety communication device 100B.

On the contrary, in the case where the comparative data error detection code is different from the received data error detection code or the comparative header error detection code is different from the received header error detection code, the error detection unit 117 may determine that the SUID of the first safety communication device 100A does not match that of the second safety communication device 100B. When it is determined that an error has occurred in the safety data, the control unit 121 of the second safety communication device 100B changes the operation state of the safety communication device 100 into the fail-safe state (operation S123). In the fail-safe state, the safety communication device 100 suspends the safety communication until the user input for reset is received. In particular, in the fail-safe state, the safety communication device 100 may or may not suspend communication other than the communication related to the safety data, but suspends at least the communication related to the safety data. When it is determined that an error has not occurred in the safety data, the control unit 121 of the second safety communication device 100B consumes the received request safety data (operation S125), and generates the response safety data to be transmitted next (operation S127).

The error detection code calculation unit 101, the protocol data unit generation unit 105, the Ethernet frame generation unit 107, and the data transmission unit 109 of the second safety communication device 100B generate the Ethernet frame including the response safety PDU including the response safety data, as described above with respect to operations S101 to S109, and then transmit the Ethernet frame to the first safety communication device 100A (operation S129).

According to an embodiment, the above-mentioned methods may be implemented with processor-readable codes in a program-recorded medium. A processor-readable recording medium includes, for example, a ROM, a RAM, a CD-ROM, a magnetic tape, a floppy disk, and an optical data storage device, and may also be implemented in the form of a carrier wave (for example, transmission via the Internet).

The above-mentioned communication device is not limited to the configurations and methods of the above-mentioned embodiments. The entirety or a part of each embodiment may be selectively combined with each other to make various modifications.

The invention claimed is:

1. A communication method for a first communication device transmitting data to a second communication device, the communication method comprising:
   generating, by a safety unique identifier generation unit of the first communication device, a safety unique identifier (ID) for confirming validity of connection between the first communication device and the second communication device using a unique ID of the first communication device and a unique ID of the second communication device;
   calculating by an error detection code calculation unit of the first communication device, a header error detection code for detecting an error of header data using the generated safety unique ID, a sequence number and the header data;
   calculating by the error detection code calculation unit of the first communication device, a data error detection code for detecting an error of safety data using the generated safety unique ID, the sequence number and the safety data;
   generating by a PDU generation unit of the first communication device, a packet comprising the safety data, the calculated data error detection code, and the calculated header error detection code; and
   transmitting by a data transmission unit of the first communication device, the generated packet to the second communication device,
   wherein the safety unique identifier is generated by using a source Media Address Control (MAC) address of the first communication device, a source device ID of the first communication device, a destination MAC address of the second communication device and a destination device ID of the second communication device,
   wherein the safety data is related to a command field, and
   wherein if a value of the command field is a first value, the safety data represents a reset command,
   if the value of the command field is a second value, the safety data represents a connection command,
   if the value of the command field is a third value, the safety data represents a parameter transmission command, and
   if the value of the command field is a fourth value, the safety data represents a data transmission command.

2. The communication method according to claim 1, wherein the generated packet does not comprise a field for transmitting the generated safety unique ID alone.

3. The communication method according to claim 1, wherein generating the safety unique ID comprises:
   generating a device ID by combining the source device ID and the destination device ID;
   generating a MAC address for the safety unique identifier by combining the source MAC address and the destination MAC address; and
   combining the device ID and the generated MAC address for the safety unique identifier.

4. A communication method for a first communication device receiving data from a second communication device, the communication method comprising:
   receiving, by a data receiving unit of the first communication device, a packet from the second communication device;
   obtaining, by a PDU analysis unit of the first communication device, safety data, a data error detection code and a header error detection code from the packet, the data error detection code calculated using the safety data, a sequence number, and a safety unique identifier (ID) for confirming validity of connection between the first communication device and the second communication device;
   calculating, by an error detection unit of the first communication device, a comparative data error detection code using the obtained safety data; and
   determining, by the error detection unit of the first communication device, whether the packet has an error based on the obtained data error detection code and the calculated comparative data error detection code,
   wherein the safety unique identifier is generated by using a source MAC (Media Address Control) address of the first communication device, a source device ID of the first communication device, a destination MAC address of the second communication device and a destination device ID of the second communication device,
   wherein the header error detection code is calculated using the safety unique ID, the sequence number and header data,
   wherein the safety data is related to a command field, and
   wherein if a value of the command field is a first value, the safety data represents a reset command,
   if the value of the command field is a second value, the safety data represents a connection command, if the value of the command field is a third value, the safety data represents a parameter transmission command, and if the value of the command field is a fourth value, the safety data represents a data transmission command.

5. The communication method according to claim 4, wherein the received packet does not comprise the safety unique identifier.

6. The communication method according to claim 4, wherein determining whether the packet has the error comprises:

comparing the calculated comparative data error detection code with the obtained data error detection code;

determining that the packet does not have the error if the calculated comparative data error detection code is equal to the obtained data error detection code; and determining that the packet has the error if the calculated comparative data error detection code is not equal to the obtained data error detection code.

7. The communication method according to claim 4, wherein the safety unique identifier is generated by combining a device ID generated by combining the source device ID and the destination device ID and a MAC address generated by combining the source MAC address and the destination MAC address.

8. The communication method according to claim 4, further comprising:

changing an operation state to a state in which communication is suspended until a user input for reset is received when it is determined that the packet has the error.

9. The communication method according to claim 6, further comprising:

changing an operation state to a state in which communication is suspended until a user input for reset is received when it is determined that the packet has the error.

* * * * *